United States Patent [19]

Weimer

[11] 4,032,903
[45] June 28, 1977

[54] CHARGE INJECTION DEVICE ARRAYS

[75] Inventor: Paul Kessler Weimer, Princeton, N.J.

[73] Assignee: RCA Corporation, New York, N.Y.

[22] Filed: Feb. 13, 1976

[21] Appl. No.: 657,888

[52] U.S. Cl. .................. 340/173 R; 307/221 R; 357/24

[51] Int. Cl.² .................................. G11C 11/40

[58] Field of Search ............ 340/173 R; 307/221 R; 357/24

[56] References Cited

UNITED STATES PATENTS

| 3,763,480 | 10/1973 | Weimer | 340/173 R |
| 3,889,245 | 6/1975 | Gosney | 340/173 R |

Primary Examiner—Terrell W. Fears
Attorney, Agent, or Firm—H. Christoffersen; Samuel Cohen

[57] ABSTRACT

During the integration of odd fields, alternate row conductors of a charge injection device (CID) array successively are placed at an operating potential at which charge carriers photoexcited in the substrate may be collected at the CID's along each such row. Isolation between such rows is achieved by successively placing the intervening row conductors at a potential to form potential barriers in the substrate. During the integration of even fields, the roles of the row conductors are reversed. Operation in this way results in vertical interlace and it permits the charge collecting locations of the CID array to be spaced relatively close to one another in the column direction, that is, it permits relatively high resolution in the column direction.

7 Claims, 20 Drawing Figures

⨯⨯⨯⨯  REGIONS OF SUBSTRATE BENEATH ROW
⨯⨯⨯⨯  CONDUCTORS WHERE CHARGE INTEGRATION OCCURS

⊠ CHARGE INTEGRATION ODD FIELDS
⊠ CHARGE INTEGRATION EVEN FIELDS

CHARGE INJECTION DEVICE ARRAYS

The present invention deals with image sensing arrays and more particularly with charge injection device (CID) arrays. In the drawings:

FIGS. 1 (a)–1(d) are plan views of known CID's;

Figure 2:
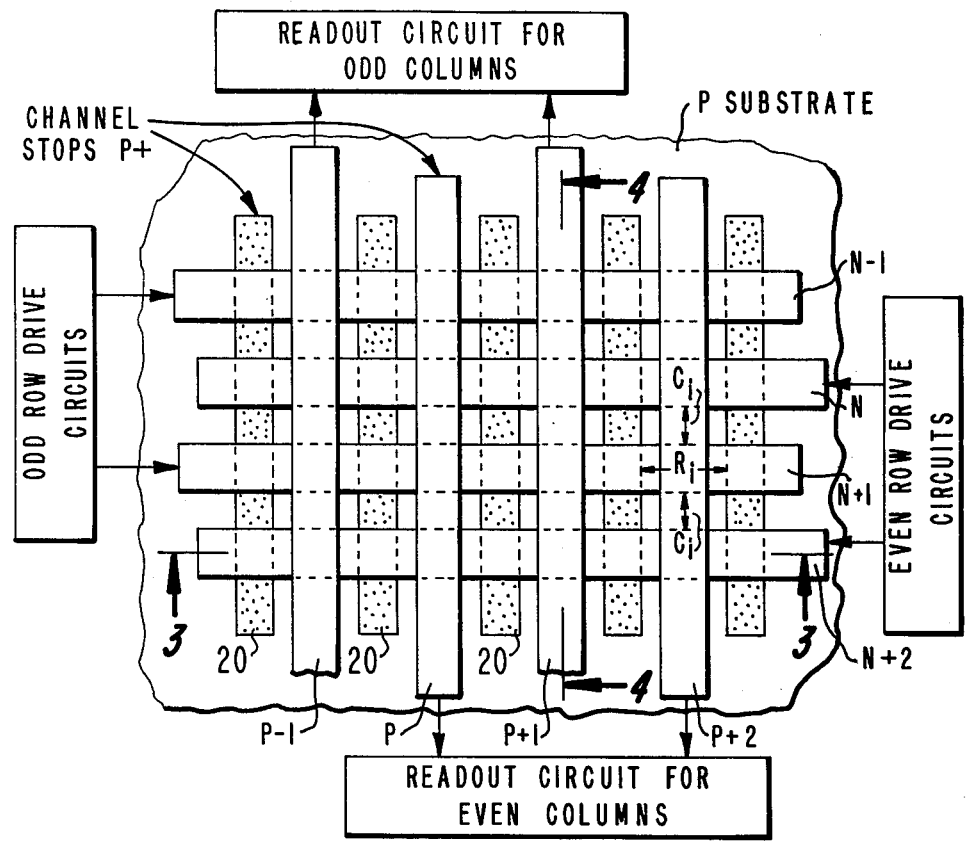
FIG. 2 is a block and plan view of a portion of a CID image sensing system embodying the present invention.
Figure 3:
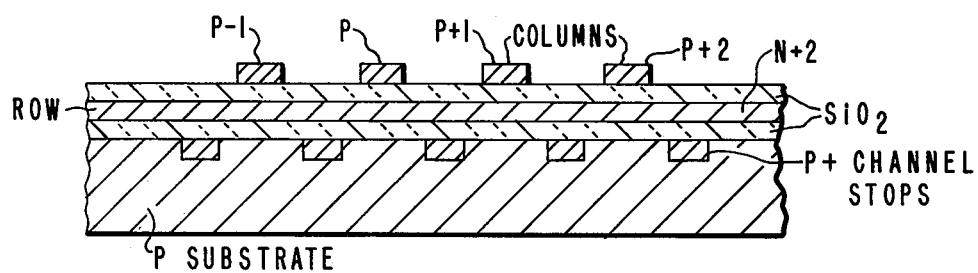
Figure 4:
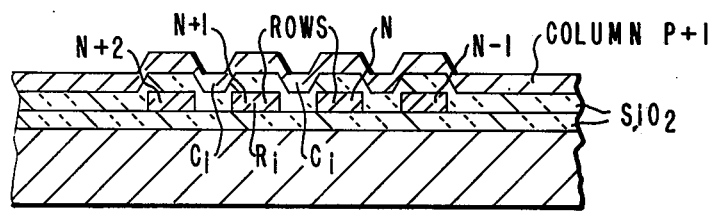
Figure 5A:
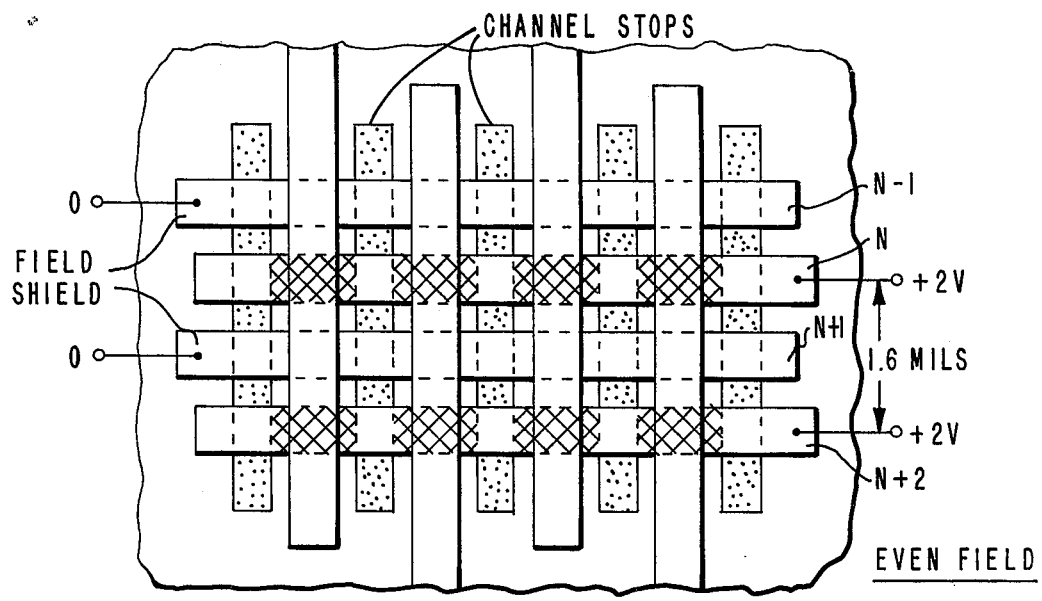
Figure 5B:
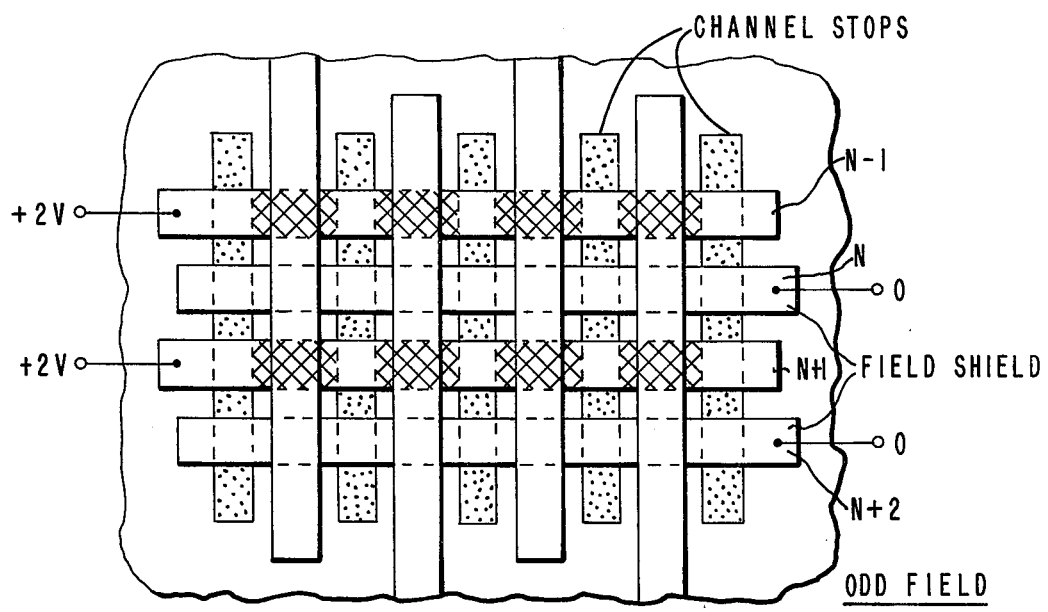
Figure 6:
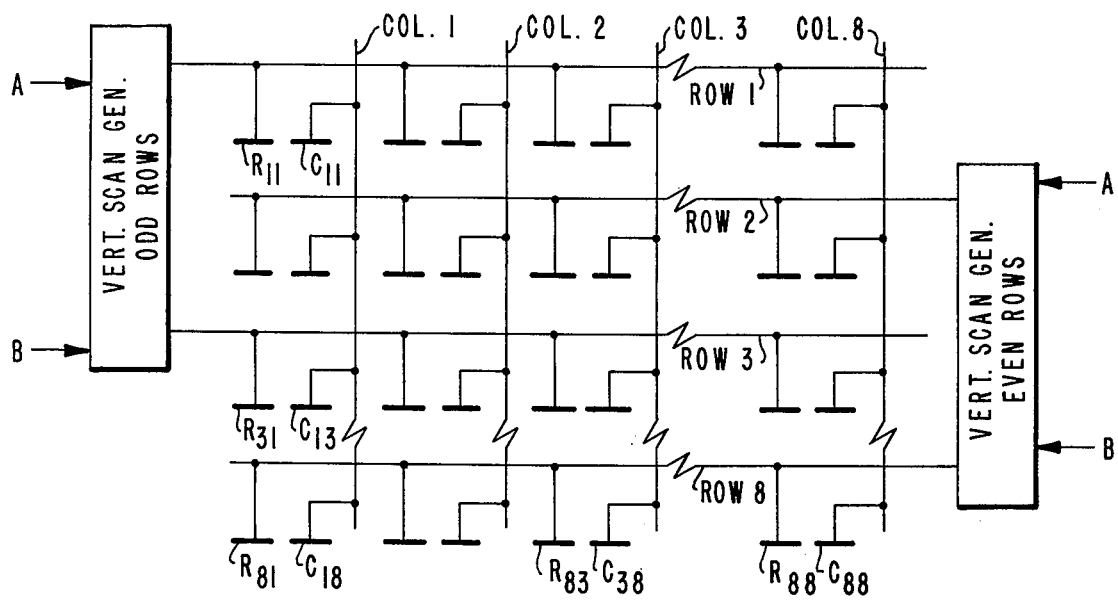
Figure 8:
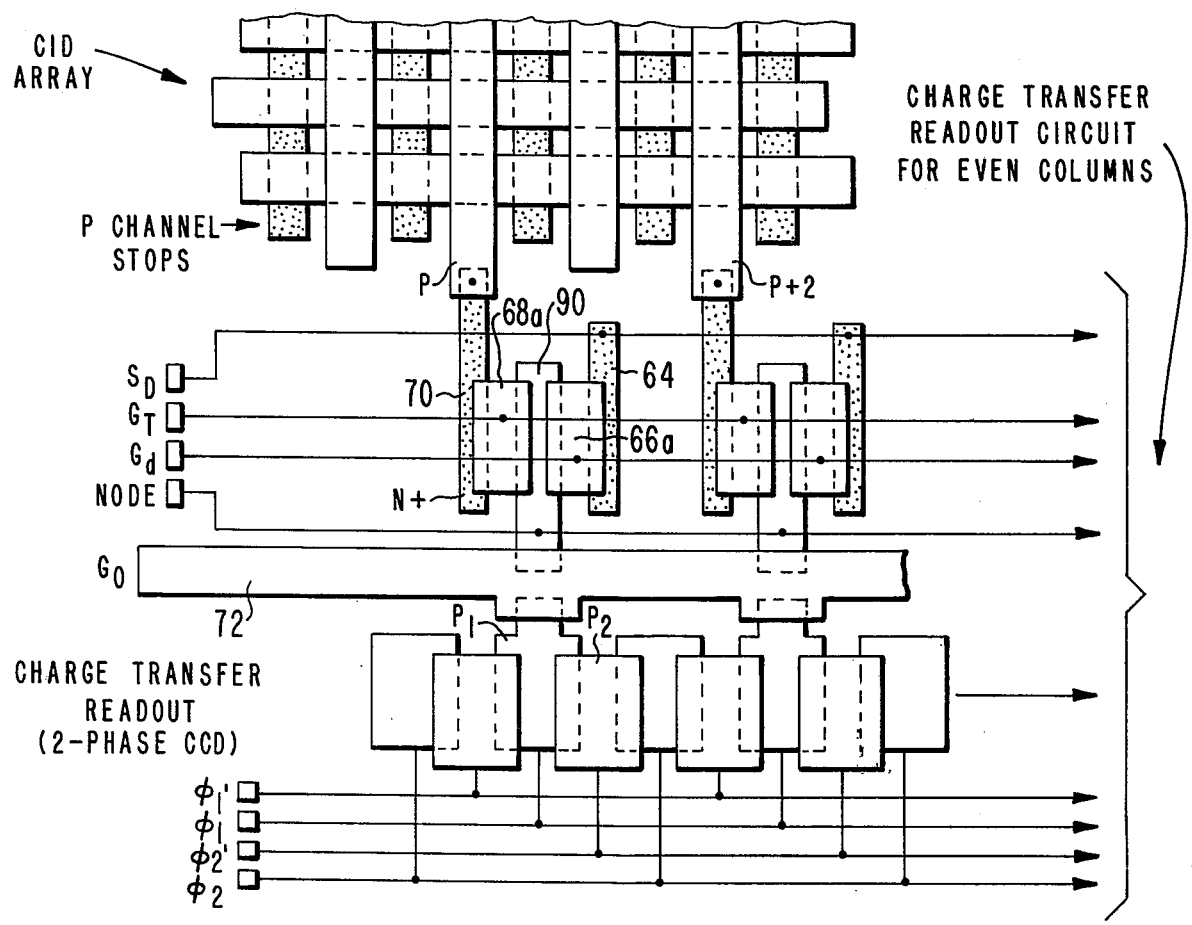
Figure 7:
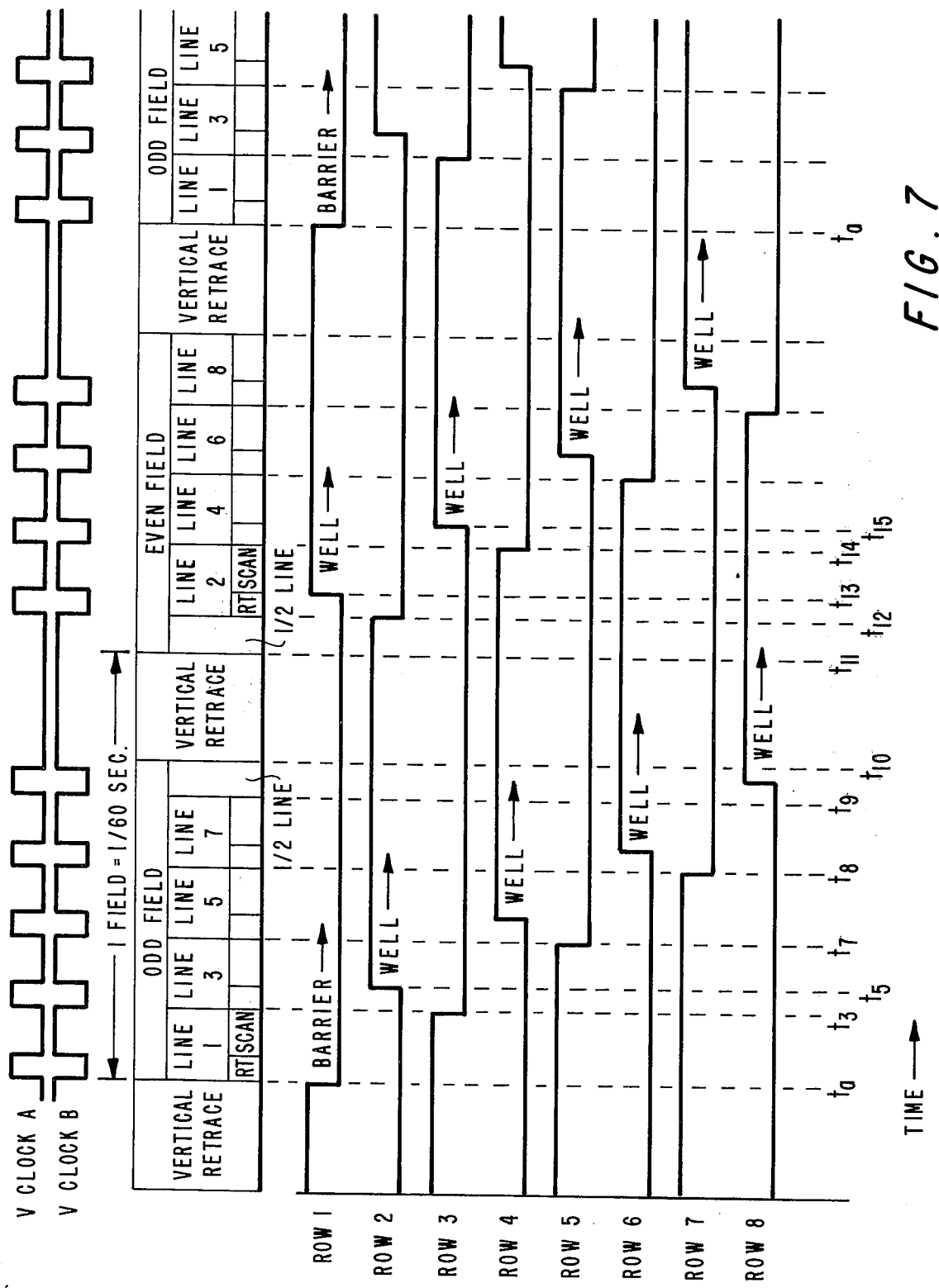
Figure 9:
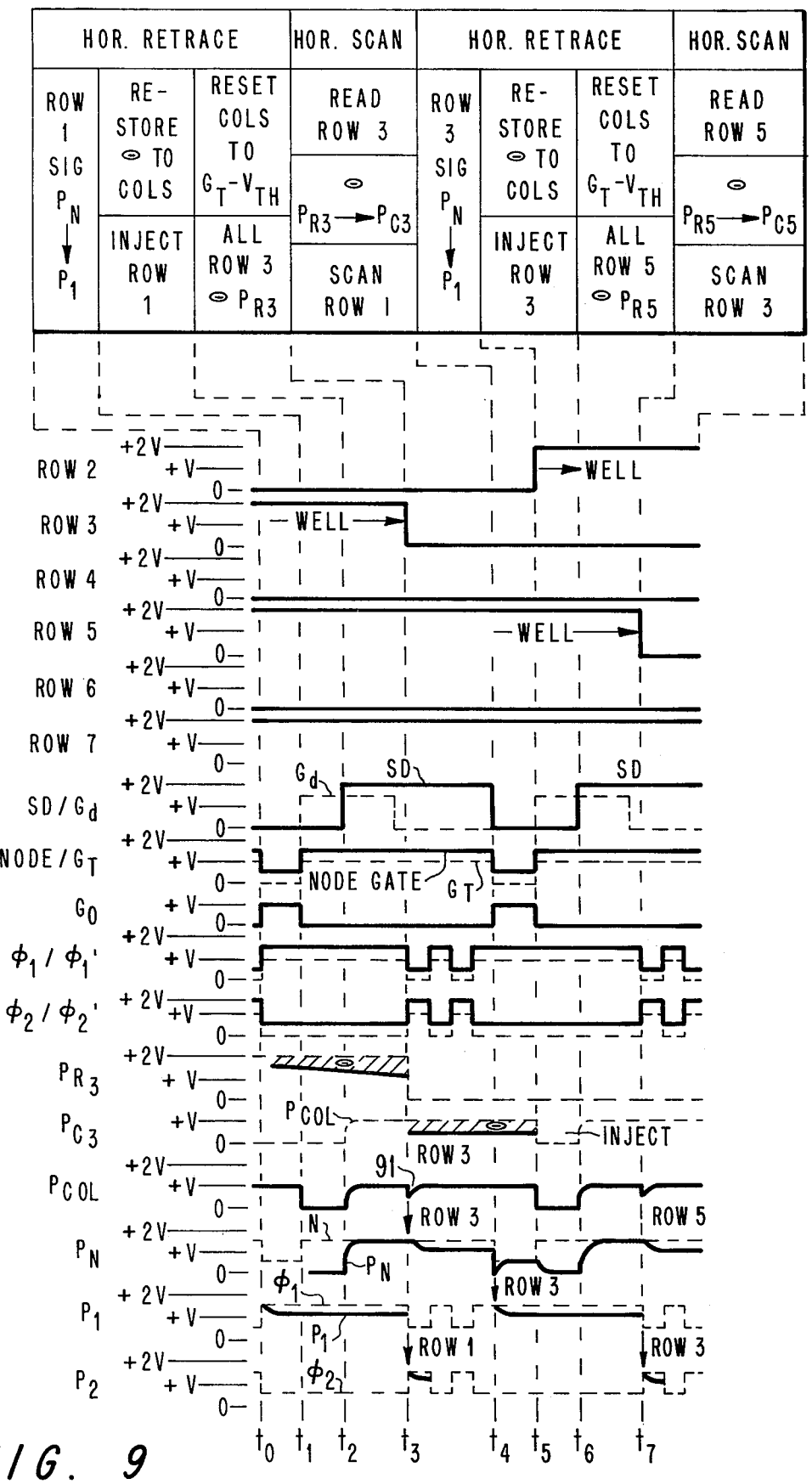
Figure 10:
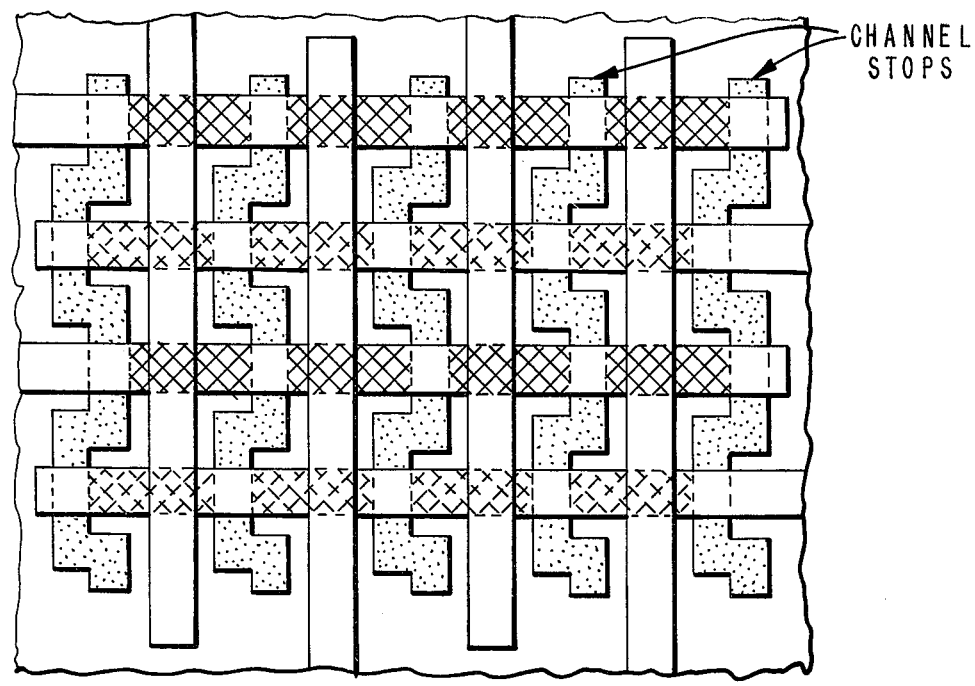
Figure 11:
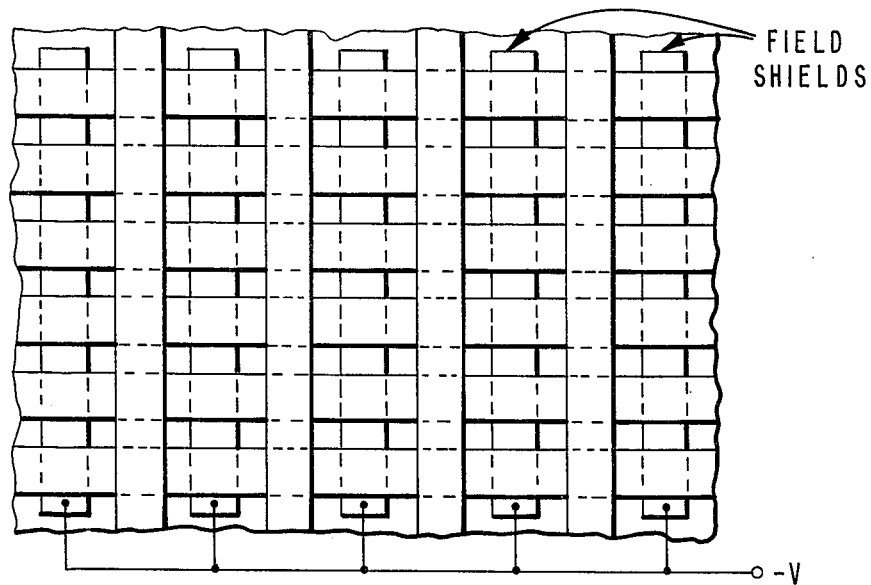

FIGS. 3 and 4 are cross sections taken along lines 3—3 and 3—4 respectively of FIG. 2;

FIGS. 5 (a) and 5 (b) are plan views of a portion of the same CID array showing the operation during odd and even fields respectively;

FIG. 6 is a block and schematic diagram of a portion of the system of FIGS. 2–5;

FIG. 7 is a drawing of waveforms to help explain the operation of the CID array of FIGS. 2–6;

FIG. 8 is a plan and schematic showing of a portion of the CID array and a readout circuit therefor;

FIG. 9 is a drawing of waveforms to help explain the operation of the circuit of FIG. 8;

FIG. 10 is a plan view of a second form of CID array embodying the invention;

FIG. 11 is a plan view of a third form of CID array embodying the invention; and FIGS. 12–15 show various circuits for obtaining horizontally interlaced fields from a CID array.

The known CID of FIGS. 1 (a) and 1 (e) includes a semiconductor substrate 10, an insulating layer 12, such as one formed of silicon dioxide ($SiO_2$) and two capacitor plates or conductors $R_t$ and $C_t$ over the insulating layer 12. When in an array, the two plates may be connected to the row (X) and column (Y) conductors, respectively, of the array. A small region 14 of opposite conductivity type to the substrate may be located at the substrate surface between the two plates $R_t$ and $C_t$, the edges of the plates preferably overlapping the region 14. Region 14, for example, may be a diffusion in the substrate. (These various elements are shown realistically in the plan view of FIG. 1 (a) and schematically, to better depict the operation, in the cross section of FIG. 1 (e).) The diffused region 14 may be omitted if the two plates $R_t$ and $C_t$ are very closely spaced or are allowed to overlap, this latter alternative form of CID being shown in FIG. 1 (b).

Figure 1A:
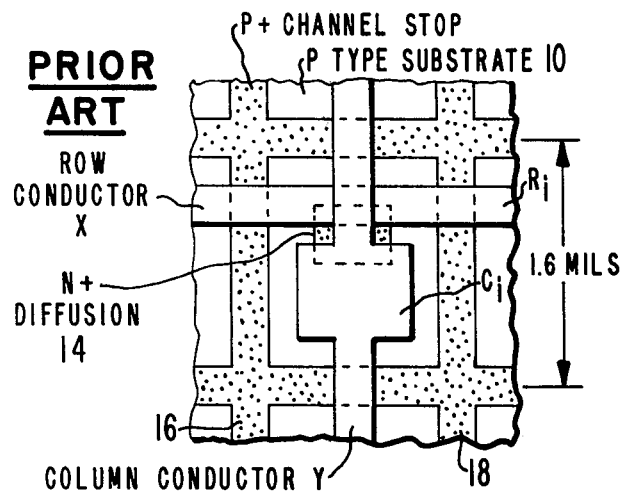
FIG. 1(e) is a cross section, in somewhat schematic form, of the CID of FIG. 1(a)

In the operation of the CID of FIGS. 1(a) and 1 (b), if a plate such as $R_t$ is maintained at such a potential as to form a depletion layer in the surface of the semiconductor (positive for the P type substrate illustrated) and light or other radiation (includng radiation from an electron source) to which the substrate is sensitive is projected onto the substrate, electron-hole pairs will be created. The radiation may be projected through the back surface of the substrate, assuming it to be suitably thinned, or through the plate $R_t$, assuming it to be transparent or relatively so, or through regions of the $SiO_2$ close to the plate $R_t$. The positive potential applied to the plate $R_t$ causes a depletion region to form in the substrate beneath this plate and the minority carriers (electrons in the case of a P type substrate) accumulate at the surface of this depletion region. If, after electrons are present beneath plate $R_t$, $V_x$ is made relatively negative (for example is returned to ground level) and $V_y$ is made relatively positive, the electrons will be repelled from the region of the substrate beneath plate $R_t$, they will pass through the conducting region created by the N type region 14, and will accumulate at the surface of the region of the substrate beneath plate $C_t$. The process can be reversed by making $R_t$ relatively positive and $C_t$ relatively negative. If desired, charges may be accumulated beneath both plates $R_t$ and $C_t$ if $V_x$ and $V_y$ are both kept relatively positive.

The CID may be read out by sensing the voltage induced on the column conductor Y when the charge signal accumulated under the plate $R_t$ is transferred to beneath plate $C_t$. A number of different systems for accomplishing such read out are described in my copending application Ser. No. 634.447 for "Charge Transfer Readout of Charge Injection Device Arrays," filed Nov. 24, 1975 now U.S. Pat. No. 4,016,550 assigned to the same assignee as the present application.

The CID may be erased by marking both $V_x$ and $V_y$ relatively negative. In response thereto, the minority carriers accumulated beneath these plates are "injected" into the substrate where they recombine with holes. A second method of reading out a CID is to couple a sensing circuit to the substrate for detecting the injection of such carriers. Here the injection along a row may be carried out sequentially to produce sequential readout signals.

For the sake of completeness and to help illustrate the problem dealt with in the present application, there are shown in FIGS, 1 (c) and 1 (d) two other known forms of CID devices. These are discussed in detail in my U.S. Pat. No. 3,521,244 issued July 21, 1970. These devices differ from the other charge injection devices discussed in this application in that the photocharges are collected on a reverse-biased diffused photodiode rather than at the surface layer of the semiconductor adjacent the insulator. The photodiode is erased by charge injection into the silicon substrate when it is forward-biased by application of suitable scanning pulses to the capacitively coupled gate buses. In the two-capacitor structure shown in FIG. 1c both the row and column buses are capacitively coupled to the diffused P+ photodiode. In the single-capacitor structure shown in FIG. 1d, the row buses consist of N+ silicon strips into which the P+ photodiodes are diffused. Each photodiode is capacitively coupled to a column gate.

It may be observed that in all of the CID devices illustrated, means must be provided for isolating each device in the array from the next adjacent devices for preventing charge at one location from passing to other locations. In the devices of FIGS. 1 (a) – (b) so called "channel stops" are employed. These comprise diffusions in the substrate of the same conductivity as the substrate but of higher impurity concentration than the substrate. Two such channel stops are shown in cross section at 16 and 18 in FIG. 1 (e) and they are shown as dotted areas in FIGS. 1 (a) and 1 (b). In the diffused photodiode CID's of FIG. 1c isolation is achieved by reverse-biasing the conducting gate strips relative to the substrate surrounding the photodiodes such that a potential barrier is formed under each gate strip. For P+ photodiodes diffused into a N-type substrate, the gate strips must be biased positively with respect to the substrate. An additional field shield strip biased negatively with respect to the substrate is inserted between the N+ row buses in FIG. 1d in order to avoid any MOS conduction between the N+ rows casued by the positively biased column buses.

While the channel stops of FIGS. 1 (a) and (b) provide the required degree of isolation from element to element, they take up space and thereby reduce the packing density which is possible in and also the resolution obtainable from an array of CID's. In one practical design, the channel stops are spaced on 1.6 mil centers in the vertical direction, using standard design rules. This means that for a reasonable size array, say one with roughly 250,000 elements (500 × 500) as desired for commercial television, the array itself will occupy an area of 0.8 inch × 0.8 inch which is already "large" in the context of present integrated circuit technology. This does not include the readout and scanning circuits which preferably should also be on the same "chip" as the CID array. Present photolithographic techniques possibly can, in some cases, somewhat reduce the 1.6 mil center-to-center spacing shown. However, if there are channel stops and also a requirement for an individual diffusion at each location, as is the case for the CID of FIGS. 1 (a), for example, this makes such size reduction more difficult because of the close proximity of these N+ diffusions to the channel stop diffusions.

The CID array of FIG. 2, which embodies the present invention, operates to produce two vertically interlaced fields. It achieves higher resolution in the column direction than arrays formed of the CID elements just discussed, operated in the same way. The design rules employed are assumed to be the same as those used in the fabrication of the known CID elements just discussed.

In the array of FIG. 2 there are no channel stops extending in the row direction. The function of the channel stops is instead provided by alternate row conductors. They are operated as field shields during the times remaining ones of the row conductors are operated as charge collecting electrodes, these field shields isolating the remaining rows from one another. The role of each row conductor is reversed for successive field periods. That is, during one time period a particular row operates as a field shield and during a following time period it operates as an electrode for the collection of charge. Horizontal isolation is obtained in the array of FIG. 2 by the use of narrow vertical channel stops 20.

Referring now to FIGS. 2–4, four rows and four columns of a relatively large array are illustrated. There are separate row drive circuits for the even and odd rows and separate readout circuits for the even and odd columns for reasons discussed in the copending application identified above; however, there could instead be a single system for driving the columns at one edge of the array and a single system for driving the rows at the other edge of the array. A single element of the array is analogous to the overlapped structure shown in FIG. 1 (b) although the structures are not identical. The plate $R_i$ consists of a portion of a row conductor and the function of plate $C_i$ is performed by two spaced regions of a column conductor one on each side of plate $R_i$. This is shown both in FIG. 2 and in the cross section of FIG. 4

The operation of the array shown in FIGS. 2–4 with standard vertical interlace requires that the voltage waveforms applied to the rows satisfy the following conditions:

1. The rows on each side of any row which is biased to form a potential well in the substrate for charge integration, must provide barriers through out the entire integration period includng the moment when the charge is transferred from beneath the plates $R_i$ of the row to beneath the plates $C_i$ of the columns. No two adjacent rows can form potential wells simultaneously without risk of degraded resolution.

2. For maximum sensitivity, a new row of potential wells for a given field must be formed as soon as possible after the adjacent row of the preceding field has been discharged and become a barrier. Each new row of wells should continue to exist, that is, charge integration should take place, for approximately one field time, or as close to it, as possible. (In an example given later, the integration time is about one line time less than a field time and this can be considered to be "substantially one field time" for an array with a reasonable number of rows). Assuming commercial television standards, to obtain approximately a full 1/60th second integration period for each row, the transition of a row conductor from its role as a field shield to its role as a charge collecting electrode, cannot be done simultaneously for all row conductors of the field. Rather it should be done a row at a time, each row conductor assuming its role as a charge collecting electrode (that is, a plurality of plates $R_i$) during the horizontal retrace period following the discharge of the adjacent row. For example, shortly after row 5 has gone relatively negative, transferring the charges collected from its R electrodes to its C electrodes (see FIG. 6), the preceding row 4 should go relatively positive. It should remain positive for approximately 1/60 second (one field time) or close to it. One line time after row 4 goes positive, and slightly after row 7 has gone negative, row 6 should go positive and remain so for about 1/60 second, and so on.

FIG. 7 illustrates the waveforms for achieving the performance described above. However, befoe discussing this FIGURE, FIG. 5 (a) and 5 (b) should be referred to. These illustrate a small region of a large array and are analogous to snap shots taken during two different fields just prior to the scanning of that area. One of the fields, arbitrarily legended the "even field" is shown in FIG. 5 (a). Charge integration is taking place beneath the even rows N and N+2 while the odd rows N−1 and N+1 are held at potentials such that they act as field shields for isolating the rows where integration is taking place from one another. Assuming the substrate to be at ground, the even row voltage +2V may be some value such as +10 volts and the field shield may be at zero volts, as examples.

The conditions are reversed during the odd fields. Now charge integration is taking place at row N−1 and N+1 whereas the conductors for rows N and N+2 are maintained at a potential such that they operate as field shields. It may be observed that the odd fields are vertically displaced relative to the even fields. Using standard television techniques, these two fields will be displayed on a screen of a kinoscope interlaced with one another. It should be noted that if the snap shots of the areas shown in FIGS. 5 (a) and 5 (b) had been taken subsequent to the scanning of that area, the roles of the row electrodes would have been reversed and the charging regions of the even field would have been located as shown in FIG. 5 (b), and those of the odd field as shown inn FIG. 5 (a).

Figure 1B:
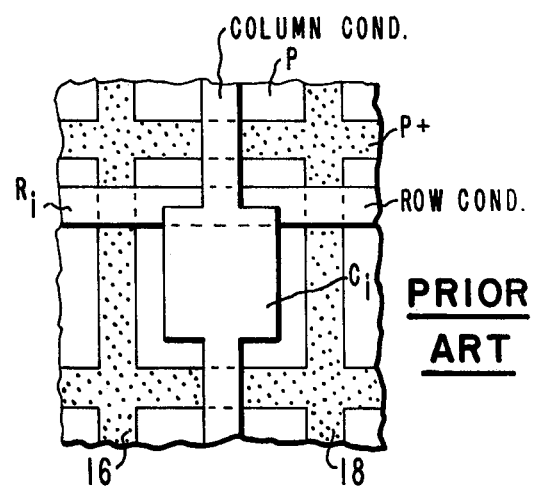
Figure 1C:
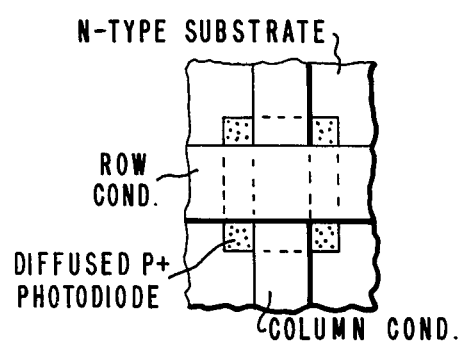
Figure 1D:
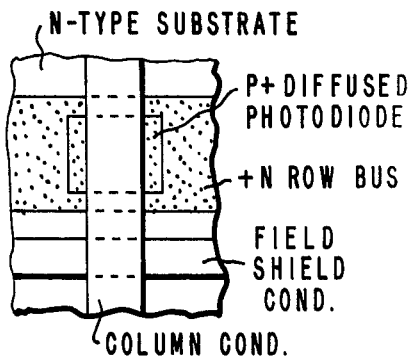
Figure 1E:
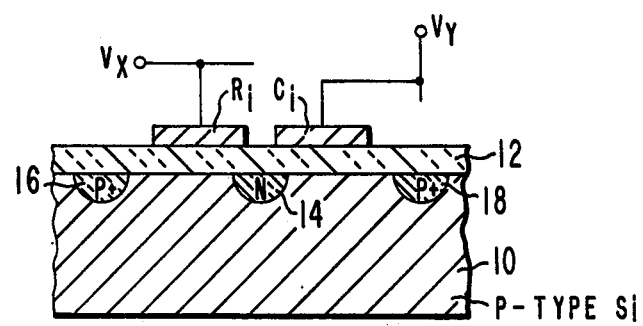

The CID elements in a field, that is, the CID elements at which charge integration is taking place can be spaced on roughly 1.6 mil centers in the array of FIGS. 2–5, using the same design rules as employed in the layouts of FIGS. 1(a) and 1(b), for example. Note in FIG. 5 (a), for example, that electrode N+1 isolates two cross hatched regions which can be spaced with the same 1.6 mils center-to-center spacing as two adjacent CID's of FIGS. 1 (a) or 1 (b). Since charge integration during the alternate field takes place on sites which are displaced half way between the sites of the first field, the effective spacing of adjacent rows in successive fields will be 0.8 mil. The total number of rows which can be resolved during one frame (or two fields) is therefore twice as great as could be resolved by the prior art structures of FIG. 1 using the same design. Although the charge integration time with interlaced operation as shown in FIG. 5 has been reduced from 1/30 sec frame time to approximately 1/60 sec field time, the total number of picture elements has been increased by a factor of two so that the total charge collected per frame remains the same. Note that the total charge-collecting areas for each element in FIGS. 2–5 remains substantially the same as in FIG. 1.

FIG. 6 is a schematic showing of a eight row by eight column CID array embodying the present invention. In order to apply the properly sequenced voltages to the rows it is convenient to connect all odd rows to one vertical generator and all even rows to an identical scan generator located on the opposite side of the array. The use of two scan generators producing identical waveforms but with displaced phase is not required but offers the advantage that the dimensions of each register need be only half as fine. The two registers are driven by the same clock voltages A and B operating at horizontal frequency. Since the output signals of the even row generator must be delayed by 1/60 second relative to the output signals of the odd row generator, the required input signal for the even row generator can be derived from the last output of the odd row generator with suitable phase adjustments to conform to the television system being used.

FIG. 7 shows the waveforms generated by the two scan generators at each of the eight rows of the system shown in FIG. 6. The two upper wave forms are the clock voltages A and B required to operate the two scan generators. When the clock A goes positive and B negative, they cause one of the row drive circuits to drive one of the row relatively negative. When clock A goes negative and B positive they cause the other row drive circuit to drive the preceding row relatively positive. For example, at time $t_a$, the clock A goes positive and the odd row drive circuits drive row 1 relatively negative. At this relatively negative potential, it is operating as a field shield. The charges discharged by row 1, that is, the charges transferred from the plates $R_{11}$ of row 1 to plates $C_{11}$ of row 1 subsequently may be employed to produce the video for line 1 of the odd field, as explained later.

At time $t_a$ the adjacent row 2 is operating as a field shield, row 3 is relatively positive and operating as a charge collection electrode, the succeeding electrodes alternate in potential. Accordingly, with respect to rows 3, 5 and 7, they are operating analogously to rows N−1 and N+1 of FIG. 5 (b) and collecting charge for lines 3, 5 and 7 of the odd field. Rows 2, 4, 6 and 8 are operating as field shields analogously to the operation of rows N and N+2 in FIG. 5 (b).

During the period $t_a$ to $t_3$, video signals produced in response to the charge which had previously accumulated in row 1 are transferred out of the CID image sensing system in a manner shortly to be discussed. Row 1 continues to operate as a barrier from time $t_a$ to time $t_{13}$ (about one field time plus one line time) when it again reverses its role and begins again to act as a charge collecting electrode.

At time $t_3$, the positive going edge of clock A causes the odd row drive circuit to drive row 3 relatively negative while the remaining rows retain their previous voltage conditions. This causes row 3 to change its role from a charge collecting electrode to a field shield. Shortly thereafter, at time $t_5$, in response to clock A going negative, the even row drive circuit drives the preceding row 2 conductor relatively positive, causing the row 2 conductor to act as a charge collecting electrode. It may be observed that at time $t_5$ the two rows 1 and 3 on each side of row 2 are operating as field shields, thereby isolating the charges collected beneath the row 2 conductor. The charges accumulated at row 2 during the period $t_5$ to $t_{12}$ (almost 1/60 sec) are the basis for the video which is later displayed as line 2 of the even field.

It is believed that the remainder of FIG. 7 is self-explanatory. In general, during the horizontal retrace time RT for line $i$ of the displayed information (the display is not shown), the signals integrated in row $(i+2)$ are read from the row. Following this retrace time, the information read from row $(i+2)$ is scanned out of the array and appears as serially occuring video signals for line $(i+2)$ (the line following line $i$ in this field) of the display. This is also discussed later in connection with FIGS. 8 and 9.

The conditions 1 and 2 outlined above are satisfied by operating in the way described by the periodic waveforms illustrated in FIG. 7. These waveforms may be employed regardless of the readout method employed; however, one specific form of readout employing charge transfer readout circuits which operate on the same general principle as discussed in the copending application identified above, will be discussed shortly.

FIG. 8 shows, in a sehematic way, a portion of the charge transfer readout circuit for the even columns which may be employed in the system of the present application. An identical circuit operated simultaneously would be connected to the odd columns, or alternatively the same circuit could be connected to both the even and odd columns. This particular readout circuit is very similar to that of FIG. 9 of the copending application and its operation for an odd field is depicted in FIG. 9 of the present application. This particular mode illustrated here differs slightly from that described in the application in that the "read" step in the present system, in which the signal from row N is transferred from the columns to the substrate region beneath elctrode 90, occurs at the same time as the signal from the preceding row N−2 of the same field is being transferred out of the CCD output register. This procedure permits maximum time for discharge of the high capacitance column conductors befoe they will be reset for receiving the signal from the next row to be scanned. Although the voltage waveforms applied to the rows in FIG. 9 follow the same sequence of changes as shown in FIG. 7, it is to be understood that minor changes in the timing are possible within the scope of the invention.

The operation of FIG. 9 will be discussed in connection with the readout of one of the rows, the readout of the other rows being similar. The time axis of the waveforms in FIG. 9 is not drawn to scale. The horizontal scan period, for example, is much, much longer than the horizontal retrace period. However, to simplify the drawing, only one and a half periods of the multiple phase pulses are illustrated rather than the several hundred periods which might be employed in a large array.

During the period $t_0$ to $t_1$, the signal previously obtained from row 1 is transferred to the CCD output register. How this is accomplished will become clear from the discussion of row 3 which follows. In this discussion, only column P of the array will be dealt with, it being understood that the same thing is occurring at all columns. FIG. 8 illustrates only the readout of the even numbered columns, but concurrently the readout of the odd numbered columns is being performed by identical charge transfer readout circuits (not shown in FIG. 8) for the odd columns.

At time $t_1$ of the horizontal retrace period, SD is relatively negative so that diffusion 64 acts as a source of electrons. Here and elsewhere capital letters generally define control voltages except for the capital letter P which generally identifies surface potentials. Also it is to be understood that the term relatively negative can refer to a potential at ground level or one which is slightly more positive than ground level. The particular value employed and its polarity will depend upon such parameters as the substrate type, whether or not it is reverse biased, the insulation thickness, and so on. At time $t_1$, Gd goes relatively positive, Gt goes relatively positive and NODE goes relatively positive. Accordingly, electrons from source 64 conducted through the conduction path beneath electrodes 66a, 90 and 68a to the diffusion 70 connected the column B, thereby restoring electrons to this column. At the same time the row 1 potential (not shown in FIG. 9) is relatively negative so that the column charges formerly present at the row 1 CID elements are injected into the substrate.

At time $t_2$, SD goes positive so that diffusion 64 goes positive and operates as a drain for electrons. Gt remains relatively positive as does Gd and the NODE potential. Accordingly, excess electrons pass from column P and diffusion 70 via the conduction path beneath electrodes 68a, 90 and 66a to diffusion 64. This action resets the column to a reference potential $G_T - V_{TH}$. As the column P will later be read out through th same device 70, 68a as employed to reset the column, the effect of column-to-column variations in the threshold voltage $V_{TH}$ of the device on the output signal is eliminated. This is discussed at length in the copending application.

At time $t_2$ the CID elements of row 3 are continuing to accumulate photo-induced charge signals beneath the plates $R_{3i}$ thereof (where $i = 1,2,\ldots Q$, Q being the number of columns in the array) and this charge accumulation continues until time $t_3$.

At time $t_3$, row 3 is driven relatively negative. This causes the charge signals in row 3 to transfer from beneath the R electrodes of the CID's to beneath the C electrodes of the CID's. This is shown by the surface potential wave forms $P_{R3}$ and $P_{C3}$ in FIG. 9. This causes a negative signal to be induced on Column P as indicated by the notch 91 in FIG. 9 in the waveform $P_{col}$. At time $t_3$, $G_T$ is still high so that a charge signal corresponding to the dip in potential of the column passes through the conduction path beneath electrode 68a to the potential well present beneath electrode 90 (note that NODE is high at a potential between +V and +2V at this time). This is shown in FIG. 9 by the reduction in surface potential $P_N$ beneath electrode 90 at the time $t_3$. Prior to $t_3$, $G_d$ had gone low to cut off SD and $G_0$ had also been cut off so that the negative signal charge induced beneath gate electrode 90 remains isolated in this well until time $t_4$ when it is transferred to $P_1$ in the output register.

Concurrently, at time $t_3$ the charge from row 1 which, as previously mentioned, is now in the CCD output register is scanned out of the register in response to the multiple phase voltages $\phi_1$, $\phi_1'$, $\phi_2$ and $\phi_2'$. This continues for an interval corresponding to one horizontal line time unitl time $t_4$, which is the beginning of the horizontal retrace period. At this point the CCD register is empty. As stated above, the charge removed from row 3 is stored beneath electrodes 90 and is waiting to be transferred into the CCD register.

At time $t_4$, $G_0$ goes high driving gate electrode 72 high. At the same time the NODE and $G_t$ voltage go low causing the charge signals stored beneath electrodes 90 to pass via the conduction paths beneath electrode 72 to the potential wells beneath the electrodes $P_1$ of the CCD output register. Note that the voltage $\phi_1$ is high at this time to permit this transfer to take place. The transfer is also shown in FIG. 9 by the reduction in the surface potential $P_1$ beneath electrode $P_1$. The arrow in FIG. 9 at time $t_4$ with the legend "row 3" next to it is intended to indicate the transfer of charge from beneath electrode 90 (surface potential $P_N$) to beneath electrode $P_1$ (the surface potential being identified also as $P_1$). SD is also switched negative at time $t_4$ in order that any stray capacitance between SD and the region between the NODE electrode will act to assist transfer of charge from beneath NODE to $P_1$. Although SD goes relatively negative at time $t_4$, it cannot act as a source of electrons until time $t_5$ when $G_d$ is again turned on.

At time $t_5$ the cycle just discussed repeats for a following row of the field (row 5 in the present instance in view of the interlaced nature of the readout). At time $t_5$, while row 3 is still relatively negative all of the columns ($P_{col}$) are again driven relatively negative by the coupling of the SD diffusion through the transistor 66a, 90, 68a, 70. Accordingly, all of the CID devices in row 3 inject their charge into the substrate and these devices are available again for the integration of charge. However, charge integration will not begin until row 3 is driven positive again. Recall that row 3 was driven negative at time $t_3$ and remains negative for approximately 1/60th of a second until time $t_{15}$ in FIG. 7. At time $t_{15}$, the accumulation of photo-excited charge in row 3 will again begin when row 3 is switched positive and will continue for approximately 1/60th of a second (actually somewhat less than 1/60th of a second). At time $t_5$ the row 5 conductor is relatively positive and the "restore" operation as already described for row 3, takes place for row 5. (The "restore" operation is necessary in order to replenish the electrons lost from the column buses which occurred during the "read" step at time $t_3$.) At time $t_6$ the reset operation takes place for row 5. In the line time beginning at $t_7$ in FIG. 9 the output register is read out to obtain the video for row 3, while at time $t_7$, row 5 is read into the wells beneath electrodes 90.

Other embodiments of the invention are illustrated in FIGS. 10 and 11. In FIG. 10 the channel stop diffusions are laid down in a square wave pattern rather than as straight lines. With the channel stops arranged in this way, both vertical and horizontal interlacing results when operating the system in the manner already described. This is illustrated in FIG. 10 by showing where integration takes place during the odd and even fields. Note that the odd fields are displaced relative to the even fields both in the horizontal and vertical directions.

Figure 12:
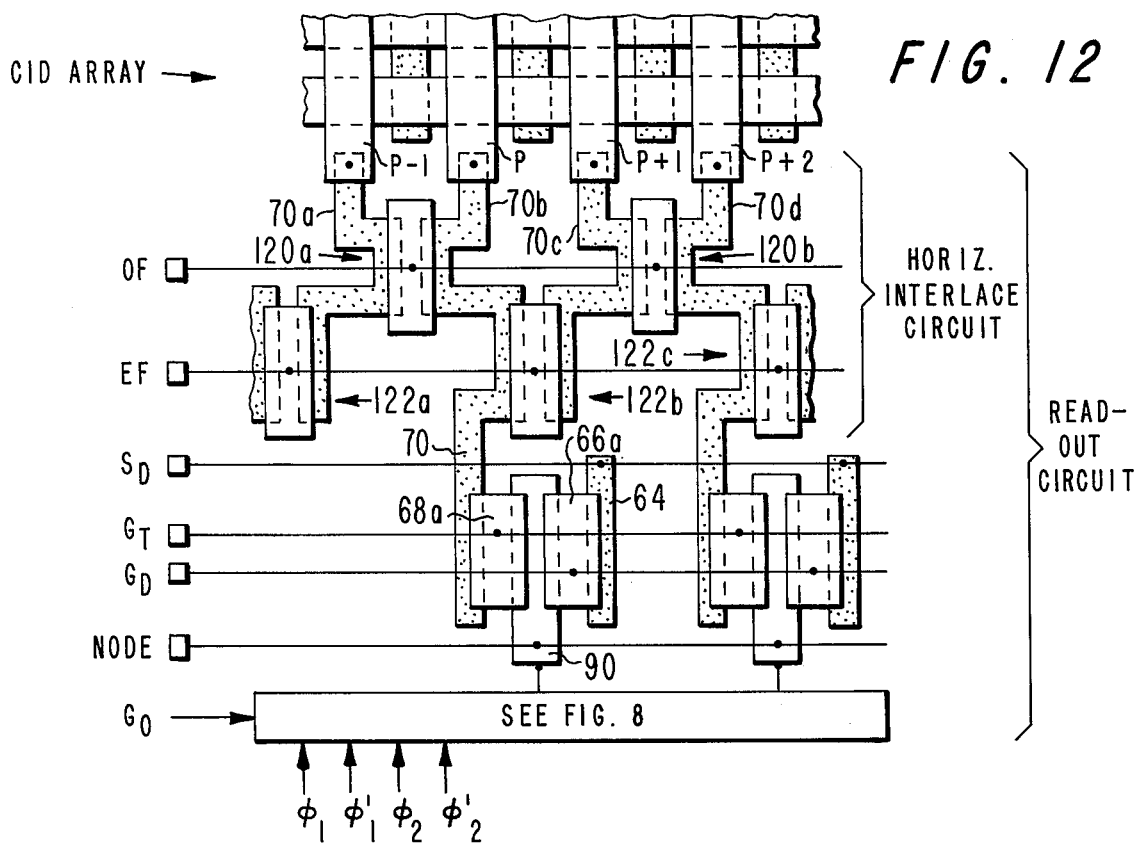
Figure 13:
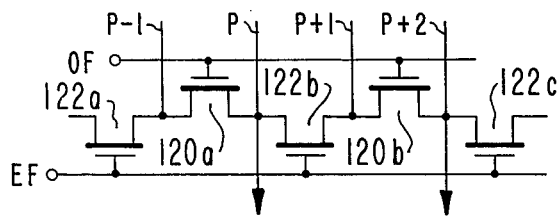

Horizontal interlace also can be achieved with a regular CID array structure such as illustrated in FIGS. 2–4 and FIG. 11 (the latter figure will be discussed shortly). A system of this type is illustrated in FIG. 12. The readout circuit may include the readout circuit elements of FIG. 8 and to show this, similar elements in the circuits of FIGS. 8 and 12 have been identified by similar reference numerals. In addition, FIG. 12 also includes a horizontal interlace circuit. It comprises one group of transistors 120a, 120b for the odd fields and a second group of transistors 122a, 122b and 122c for the even fields. These are shown in plan view in FIG. 12 and schematically in FIG. 13.

The operation of the system of FIG. 12 is similar, in principle, to that described in U.S. Pat. No. 3,911,467 to P. A. Levine and J. E. Carnes, issued Oct. 7, 1975, insofar as combining signals from adjacent columns is concerned. For the odd fields, the odd field control signal OF is made sufficiently positive to turn on transistors 120 hard and the even field control field signal EF is made relatively negative, for example the latter may be at ground level to turn off transistors 122. The result is that the charge signal present, for example, at columns P−1 and P are combined and flow from diffusions 70a and 70b to diffusion 70. The same thing occurs at the next two columns, that is, the charge signal P+1 combines with that at P+2, and so on. The remainder of the readout process is the same as already discussed in connection with FIG. 8.

For the even fields, OF is relatively negative and EF is relatively positive so that transistors 120 are off and transistors 122 are on hard. The result is to combine the charge signals for columns P and P+1, these two signals being combined by transistors 122b and flowing to diffusion 70. Similarly, the charge signal at column P+2, is combined with that of column P+3 (not shown) and so on. Again, the remainder of the readout operation is similar to that already discussed in connection with FIG. 8. In both of the cases discussed above, the respective transistors are turned on during the vertical retrace period to combine signals.

The effect of operation in the manner discussed above is to obtain two horizontally interlaced fields, that is, one shifted laterally by one column relative to the other, and the advantage of operation in this way is to reduce aliasing, also known as moire, between vertical bars in a scene and the vertical pattern of a horizontal clock signal. The video signals obtained during the even field must be delayed one-half cycle before display to obtain correct superimposition of the two fields. The presence of the additional transistors have no substantial effect on the operation of the readout circuit except for the first and last columns of the array.

When employing the system of FIG. 12, the entire readout circuit is at one edge of the array, that is, duplicate circuits at the top and bottom of the array are not needed. The reason, of course, is that during each field the horizontal interlace circuit combines the charge present in each pair of columns. Also, in the present circuit as the combining takes place between the columns and the charge transfer register, the size of the register can be small-it need contain only half as many stages as there are columns in the array.

Figure 14:
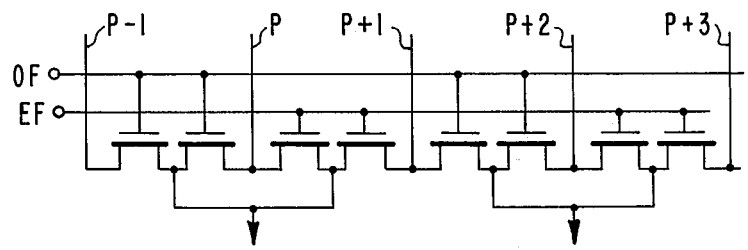
Figure 15:
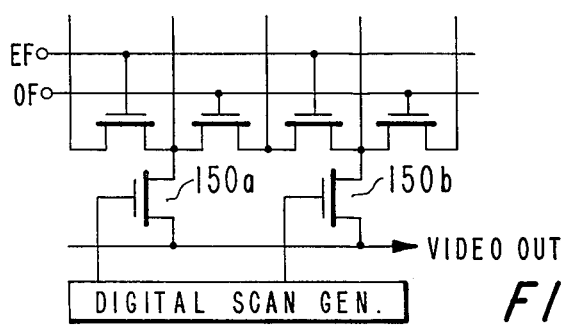

While the system of FIG. 12 has been illustrated in terms of charge transfer readout, it should be appreciated that other forms of readout circuits such as multiplexed readout circuits may be used instead. Further, while in the system of FIG. 12 both vertical and horizontal interlacing are obtained, the present invention is equally applicable to horizontal interlace without vertical interlace. Further, alternative forms of horizontal interlace circuits may be employed. One such alternative employing two transistors per column is illustrated in FIG. 14. In the circuit of FIG. 14, the two control voltages OF and EF may replace three control voltages OF, EF and GT in FIG. 12. Another alternative is illustrated in FIG. 15. Here the readout circuit comprises a digital scan generator for activating the column transistors 150a, 150b in succession to obtain serial readout. The horizontal interlacing is obtained in response to the control voltages EF and OF in the manner already discussed.

The array of FIG. 11 is quite similar to the one of FIG. 2. The difference is that vertical field shields are employed rather than channel stops. While the use of field shields is advantageous in that no diffusions need be employed in the array itself and this somewhat simplifies the construction, it is disadvantageous in that an additional electrode disposition layer and an additional insulating layer are required. The operation of the systems of FIGS. 10 and 11 is essentially identical to the operation of the system of FIG. 2.

As already mentioned, while only one method of readout is discussed herein, others may be used. For example, the signal may be derived from the substrate by sequential injection of CID elements along each row, or by column readout followed by simultaneous injection of a row at a time. One method of obtaining the signal from the columns is by means of an external multiplexer, gated by a digital horizontal scan generator. When sequential injection along each row is used, the video signal can be derived from either the substrate or from the column buses.

The present application has discussed CID arrays in which the vertical resolution can be improved by a factor of two over similar non-interlaced structures using the same design rules. Although the horizontal tolerances have not been changed, the resulting structure is simple enough that a high picture element density can also be achieved in the horizontal direction. The procedure illustrated of connecting alternate columns to duplicate output registers operating in parallel reduces the number of stages required for each horizontal register by a factor of two and reduces any possible horizontal resolution limitation imposed by the output register structure. The connecting of alternate rows to duplicate vertical scan generators also reduces any limitation of vertical resolution by the inter-stage spacing of the vertical shift registers.

While the various embodiments of the invention have been described and illustrated in terms of P type substrate (N channel) CID arrays, it is to be appreciated that N type substrates (P channel) may be used instead. Further, the voltage levels, biases and so on are intended only to be illustrative. The column and row conductors may be made of polysilicon or transparent metal, as examples, for "front surface" illuminated arrays or of aluminum, polysilicon or other conductors for "back surface" illuminated arrays.

The present invention is especially applicable to CID's of the type not requiring an individual diffusion (such as 14 of FIG. 1 (a)) at each location. The reason is that a CID which does not require such a diffusion is simpler to fabricate and higher packing density is possible. With CID's having diffused islands, increased resolution is possible using the teachings of the present application, provided the island does not completely shunt the field shield gate. Thus the system is applicable, for example, to the CID of FIG. 1a. Vertical resolution can be improved also in an array of CID's such as shown in FIG. 1d if the CID's are rotated 90° so that the gate is horizontal.

What is claimed is:

1. The combination of:
   an array of charge injection devices arranged in columns and rows, each device comprising a portion of a row conductor insulated from and electrically coupled to a semiconductor substrate, and a portion of a column conductor which crosses and thereby overlaps the edges of the row conductor and which is insulated from both the row conductor an substrate but which is electrically coupled to the substrate in the region thereof adjacent to the column conductor;
   means for applying an operating voltage to one set of alternate row conductors of said array, of a polarity to cause potential wells to form in the substrate, each such alternate row conductor receiving said operating voltage for a period sufficient to cause the collection of photo-induced charge carriers for a period approximately equal to the duration of one field of an interlaced frame;
   means for applying a voltage for creating a potential barrier in the substrate, to the row conductors on each side of any row conductor receiving an operating voltage, during the time that operating voltage is being applied to that row conductor, and in the case of an end row conductor receiving an operating voltage, for applying a voltage for creating a potential barrier in the substrate to the row conductor adjacent to said end row conductor during the time that operating voltage is being applied to said end row conductor; and
   means for then reversing the roles played by the row conductors, that is, by applying an operating voltage in the manner stated above, to the other set of alternate row conductors of the array, and applying a voltage for creating a potential barrier to the one set of alternate conductors for causing the collection of photo-induced charge carriers to be scanned during the second field of an interlaced frame.

2. The combination set forth in claim 1, wherein said means for applying an operating voltage comprises means for successively applying said operating voltage to successive ones of said alternate conductors, each conductor of said one set receiving said operating voltage shortly after said operating voltage has been removed from the adjacent following row conductor, and continuing to receive said operating voltage for approximately one field time.

3. The combination as set forth in claim 2, wherein said means for applying an operating voltage to said one set of alternate conductors comprises means for applying said voltage to each alternate conductor approximately one line time after said operating voltage is applied to the previous row conductor of said set, except in the case of the first conductor of said set, said first conductor receiving its operating voltage shortly after the vertical retrace period of a field.

4. The combination of an array of charge injection devices arranged in columns and rows, each device including as one element thereof spaced portions of a row conductor; and
   means for operating said array so as to obtain the signals required for two vertically interlaced fields said means comprising:
   means, during the time each given alternate row conductor of one set of rows of the array is maintained at a potential for integrating photo-induced charge carriers in one field, for operating the two row conductors, one adjacent to each side of that given row conductor, or in the case the given row conductor is an end conductor of the array, the one row conductor adjacent to said given row conductor, at a potential to produce potential barriers or barrier, respectively, for electrically isolating that given row conductor; and
   means during the time each particular alternate row conductor of the other set of rows is maintained at a potential for integrating photo induced charge carriers in the other field, for operating the two row conductors, one adjacent to each side of that particular row of the other set, or in the case the particular row conductor is an end conductor of the array, the one row conductor adjacent to said particular row conductor, at a potential to produce potential barriers or barrier, respectively, for isolating that particular row.

5. The combination as set forth in claim 4 further including:
   means for the readout of the two vertically interlaced fields from the array in such a way that they may be horizontally interlaced as well, comprising:
   means for placing the rows of each field successively at potentials to induce signals on the columns of the array indicative of the charge signals stored in the charge injection devices of each row;
   means for combining the signals induced on each $i$'th column of the array with those induced on each $i+1$'th column of the array during the readout of the successive rows of one field; and
   means for combining the signals induced on each $i$'th column of the array with those induced on each $i-1$'th column of the array during the readout of the successive rows of the other field, where $i$ is an even integer equal to 2, 4, ---Q, and where the array includes at least Q columns.

6. The combination of:
   an array of charge injection devices arranged in columns and rows;
   means for maintaining said devices at potentials to permit the accumulation of charge signals while an image is projected on said array; and
   means for thereafter reading the charge signals from said array said means comprising:
   means for reading one field from the array comprising means for placing alternate rows of the array successively at potentials to induce signals on the columns of the array indicative of the charge signals stored in the charge injection devices of said successive alternate rows, and means for combining the signals induced on each $i$'th column of the array with those induced on each $i+1$'th column during the readout of row, where $i$ is an even integer equal to 2, 4,---Q, and where the array includes at least Q columns; and
   means for reading a second field from the array which may be horizontally interlaced with the first field comprising means for placing the remaining alternate rows of the array successively at potentials to induce signals on the columns of the array indicative of the charge signals stored in the charge injection devices of said successive alternate rows, and means for combining the signals induced on each $i$'th column of the array with those induced on each $i-1$'th column during the readout of each row of said second field.

7. In combination:
two charge injection devices within an array, in one column of the array, comprising a semiconductor substrate, two row conductors and a column conductor crossing said two row conductors and insulated therefrom, said two row conductors and said column conductor coupled to and insulated from said substrate; and means during one field for operating one row conductor at a potential such that photo-induced charge carriers can accumulate in the substrate, and the other conductor at a potential such that a barrier is formed in the substrate, and during a second field for operating said one row conductor at a potential such that a barrier is formed in the substrate, and said other row conductor at a potential such that photo-induced charge carriers can accumulate in the substrate.

* * * * *